(12) United States Patent
Houlihane

(10) Patent No.: US 7,444,257 B2
(45) Date of Patent: Oct. 28, 2008

(54) GENERATION OF A TESTBENCH FOR A REPRESENTATION OF A DEVICE

(75) Inventor: Thomas Sean Houlihane, Bassingbourn (GB)

(73) Assignee: Arm Limited, Cambridge (GB)

( * ) Notice: Subject to any disclaimer, the term of this patent is extended or adjusted under 35 U.S.C. 154(b) by 675 days.

(21) Appl. No.: 10/743,473

(22) Filed: Dec. 23, 2003

(65) Prior Publication Data

US 2005/0004777 A1 Jan. 6, 2005

(30) Foreign Application Priority Data

Jul. 2, 2003 (EP) ................................. 03250803

(51) Int. Cl.
*G01R 31/00* (2006.01)
*G01R 31/14* (2006.01)
(52) U.S. Cl. ..................................... 702/119
(58) Field of Classification Search ................ 702/119, 702/123, 120; 703/15, 28
See application file for complete search history.

(56) References Cited

U.S. PATENT DOCUMENTS

| 5,923,867 | A | 7/1999 | Hand | |
| 6,876,941 | B2 * | 4/2005 | Nightingale | 702/120 |
| 2002/0188432 | A1 | 12/2002 | Houlihane et al. | |
| 2003/0009730 | A1 | 1/2003 | Chen et al. | |
| 2004/0111252 | A1 * | 6/2004 | Burgun et al. | 703/28 |
| 2004/0243334 | A1 * | 12/2004 | Wrigley et al. | 702/108 |

FOREIGN PATENT DOCUMENTS

WO WO 02/39325 5/2002

OTHER PUBLICATIONS

N. Sharma et al, "Verifying an ARM Core" *Integrated System Design*, Mar. 2001.
Paper entitled Submission of Prior Art Under 37 CFR 1.501, 6 pages, Mar. 22, 2007.
Presentation slides entitled *System-on-chip (SOC) and its Effect on Microcomputer Bus Products*, as presented to the VMEbus Standards Organization (VSO) on Jul. 21, 1999, in Vancouver, B.C., Canada, 31 pages.
Technical reference manual entitled *VME64 to PCI Bridge System-on-Chip (SoC)*, first published by Silicore Corporation on Dec. 7, 2002, 129 pages.

(Continued)

*Primary Examiner*—Michael P Nghiem
(74) *Attorney, Agent, or Firm*—Nixon & Vanderhye P.C.

(57) ABSTRACT

A system and method for generating a testbench for a representation of a device to be incorporated in a data processing apparatus is provided. The representation of the device is configurable based on configuration data specifying predetermined attributes of one or more components of the data processing apparatus with which that device is to be coupled, and the testbench provides a test environment that represents those one or more components. The method includes receiving the configuration data used to configure the representation of the device, and generating the testbench with reference to the configuration data and a first set of templates defining the test environment. By this approach, a matching testbench can automatically be generated for any particular instantiation of the configurable representation of the device to enable thorough verification testing of that instantiation of the device to be performed.

42 Claims, 11 Drawing Sheets

OTHER PUBLICATIONS

VHDL source code files representing the VMEcore entity and testbench, as produced by Silicore Corporation's parametric core generator know as *The VMEbus Interface Writer* ™ on Feb. 14, 2002, 46 pages.

VHDL source code files representing the VMEcore entity as distributed with the *VME64 to PCI Bridge System-on-Chip* (*SoC*), and described at §4.7.3 VHDL *Synthesis and Test* (p. 81) in the technical reference manual, 31 pages, Feb. 14, 2006.

*Wishbone System-on-Chip (SoC) Interconnection Architecture for Portable IP Cores*, Revision B.2, dated Oct. 10, 2001, 109 pages.

Press release from Altium Ltd. (Sydney, Australia) entitled *Altium Unveils new 'Board-on-Chip' Technology*, dated Apr. 28, 2003, 3 pages.

Press release from Altium Ltd. (Sydney, Australia) entitled *Altium Introduces Systems Focus to FPGA Design with Nexar*, dated Nov. 17, 2003, 5 pages.

* cited by examiner

GENERATION OF A TESTBENCH FOR A REPRESENTATION OF A DEVICE

BACKGROUND OF THE INVENTION

1. Field of the Invention

The present invention relates to techniques for generating a testbench for a representation of a device, so as to allow that representation of the device to be tested prior to the production of an actual device based on that representation.

2. Description of the Prior Art

When developing components for integration into a system, a number of test procedures are typically performed to ensure that the component will operate in the desired manner when integrated into the system.

The development of a hardware component (also referred to herein as a device) typically takes place in a number of stages. Firstly, the functional operation/behavior of the component is defined, for example using a Register Transfer Language (RTL). Two popular RTLs used are VHDL and Verilog. In addition, prior to performing such RTL coding, a behavioural model may be built using a UML (Universal Modelling Language) to validate at a transactional level that the design intent is correct.

Once an RTL representation of the hardware component has been developed, this is then synthesised into a sequence of hardware elements using any of a number of known synthesising tools. The result of the synthesis is a hardware design that can then be used to produce the actual hardware component, for example using appropriate fabrication of the component on silicon. It would clearly be very costly to perform test procedures on the component once it has actually been reduced to hardware, and instead rigorous testing of the RTL representation of the component is typically performed to ensure that the actual hardware generated from that RTL representation will operate correctly.

Such testing of the RTL representation typically involves the use of a testbench model providing a test environment for the RTL representation of the component, which is then run on a simulation tool to produce test results which can be analysed to determine whether the RTL representation of the component is operating as required.

The testbench can be formed in a variety of ways. For example, the testbench could be formed to provide a test environment for testing the RTL representation of the component in isolation, which enables direct control of the input stimuli to the RTL representation of the component. However, this requires a particular testbench to be produced for that component representation. Another approach is to combine that RTL representation of the component to be tested with RTL representations of other components that have already been tested, and with which the component to be tested will interact. Hence, in this approach, a portion of the overall system into which the component is intended to be placed is represented in RTL, and a testbench is then constructed based on that RTL representation of the system portion. This avoids the need to produce a particular testbench specifically for the component to be tested, but results in loss of direct control over the input stimuli to the RTL representation of the particular component to be tested.

It is possible to make a particular representation of a component configurable, for example in situations where the actual construction of the component may depend on the arrangement of other components within the system with which that component is intended to interact. One example of such a component which may be configurable is a bus interconnect block which defines the bus connections between various other devices within the system. The bus interconnect block will hence define the bus infrastructure that allows a number of master devices to access a number of slave devices. In such interconnect blocks, each master may be arranged to access a different sub-set of the slave devices, may be arranged to use different memory maps to those used by other master devices, and further each slave device may be arranged to use one of a number of different arbitration schemes. In this example, it will be appreciated that the actual layout of any particular bus interconnect block will depend on the specification of a number of different configurable parameters, such as the number of master devices in the system, the number of slave devices in the system, identification of the slave devices accessible by each master, etc.

Once these configurable parameters have been specified via some configuration data, it is then possible to generate a particular instantiation of the representation of the component. However, with many such instantiations possible, it has generally been considered impractical to try and provide a testbench which can test in isolation the configurable representation of the component to ensure that a working instantiation of that RTL representation can be created under all configuration options.

One option would be to perform detailed testing of a representative subset of configurations, and infer that every other configuration will perform similarly, but this is risky as it assumes that the configuration and generation always work exactly as planned.

Accordingly, instead, it is typically the case that when a particular instantiation of such a configurable RTL representation of a component is produced based on some configuration data, then that RTL representation is placed within an RTL representation of a portion of the system including RTL representations of other components with which it will interact. However, as mentioned earlier, the use of such an approach results in the loss of direct control over the input stimuli to the RTL representation of the component being tested, and hence is a less satisfactory test procedure.

Accordingly, it would be desirable to provide an improved technique for generating a testbench to be used in association with a representation of a device which is configurable.

SUMMARY OF THE INVENTION

Viewed from a first aspect, the present invention provides a method of generating, for a representation of a device to be incorporated in a data processing apparatus, a testbench providing a test environment that represents one or more components of the data processing apparatus with which that device is to be coupled, the representation of the device being configurable based on configuration data specifying predetermined attributes of the one or more components, the method comprising the steps of: (a) receiving the configuration data used to configure the representation of the device; and (b) generating the testbench with reference to the configuration data and a first set of templates defining the test environment.

In accordance with the present invention a method is provided for generating a testbench providing a test environment for a representation of a device (also referred to herein as a Device Under Test (DUT)) to be incorporated in a data processing apparatus. In particular, the testbench provides a test environment representing one or more components of the data processing apparatus with which that device is to be coupled. The representation of the device is configurable based on configuration data specifying predetermined attributes of those one or more components. The method of the present invention involves receiving that configuration data used to configure the representation of the device, and generating the testbench with reference to that configuration data and a set of templates defining the test environment.

Hence, in accordance with the present invention, the same configuration data that is used to configure the representation of the device is also used to generate a testbench, with the testbench being defined in a modular way with reference to a set of templates. By this approach, it is possible to generate a testbench which matches the top-level of the DUT, thereby allowing any possible configuration of the DUT to be tested, once that particular configuration of the DUT has been generated.

Hence, in situations where configurable DUTs are provided to allow for the generation of customisable designs for that DUT, the present invention provides a technique which allows for a matching testbench to be generated for any particular instantiation of that customisable design, which then allows that customisable design to be tested in isolation, thereby allowing a comprehensive verification test to be run on the generated DUT design. In particular, direct control of the input stimuli to that DUT is now possible.

It will be appreciated that the representation of the device may be generated in a variety of ways. However, in one embodiment, the method further comprises the step of: (c) generating the representation of the device with reference to the configuration data and a second set of templates defining the representation of the device.

Hence, a second set of templates are provided defining the representation of the device in a modular way, with any particular representation of the device then being generated with reference to the configuration file and that second set of templates.

In one embodiment, the method further comprises the step of: providing a processing tool having access to the configuration data and the first and second sets of templates, said steps (b) and (c) being performed by the processing tool. This provides a particularly efficient embodiment for generation of both the representation of the device and its associated testbench using the same processing tool, the processing tool using the first set of templates to generate the testbench and the second set of templates to generate the representation of the device, both actions being performed with reference to the same configuration file, thereby ensuring that any particular representation of the device generated will also result in the generation of a matching testbench to allow comprehensive testing of that representation of the device.

When the processing tool processes a particular template with reference to the configuration file, this will result in the generation of a corresponding portion of either the testbench or the representation of the device (depending on whether the template is from the first set or the second set of templates, respectively) and that particular portion produced will be in a particular language. In one embodiment of the present invention, the actual language produced will be dependent on the constructs used in each template, and accordingly the processing tool is operable independent of a language produced by the processing tool from each template.

In a preferred embodiment of the present invention, the representation of the device is provided in a first language type and at said step (b) a part of the testbench defined by a number of the templates in the first set is generated in a second language type different to the first language type. The part of the testbench generated in the second language type may be the entire testbench, or some portion of it. In one particular embodiment, there will be certain portions of the testbench that are generated in the first language type.

The above described approach whereby a part of the testbench is generated in a second language type different to the first language type reduces the chance that any defect generated in the representation of the device to be tested is perfectly matched with a defect in the testbench, since it may allow a different style of coding for a specific function, and hence provides more certainty that the generated testbench will be able to detect such defects in the DUT design.

In one particular embodiment, the first language type is a Register Transfer Language (RTL), and said second language type is a High level Verification Language (HVL). As mentioned previously, examples of suitable RTLs are VHDL or Verilog. Examples of suitable HVLs are Vera or Specman.

The techniques of the present invention may be utilised to generate a testbench for any suitable configurable representation of a device. However, in one embodiment of the present invention, the device is a bus interconnect block. In one particular embodiment, the bus interconnect block allows one or more master units to access one or more slave devices via a bus network contained within the bus interconnect block. Each master may be able to access a different sub-set of the slave devices, and may for example use a different memory map, and each slave device may be able to use one of a number of different arbitration schemes. The bus interconnect block of one embodiment provides a bus interface to each master unit and each slave unit, and provides the various interconnections between those bus interfaces.

The operation of the buses will typically be defined by a bus specification, which will often provide a standard interface to each component connected to the bus. In one embodiment, the buses used operate in accordance with the "Advanced Microcontroller Bus Architecture " (AMBA) specification developed by ARM Limited, which provides a standard interface to components connected to the bus.

Once a representation of a device and its matching testbench have been generated in accordance with the above-described methods, then a simulation tool can be used to run a model of the data processing apparatus using that representation of the device and the testbench in order to generate some test results which can be analysed to determine whether the representation of the device is operating as desired.

The testbench is used to perform the testing procedures, and accordingly needs to be provided with suitable elements for performing the required testing. In one embodiment, the first set of templates includes a master template defining a master engine coupled to a bus and operable during running of the model to generate test stimuli for input via the bus to the representation of the device. Hence, during generation of the testbench, a master template can be used to generate one or more master engines for inputting test stimuli to the representation of the device to be tested. Typically, the configuration data will identify the number of master units that are intended to be coupled to the device, and accordingly the master template can be used as required to produce a corresponding number of master engines.

In preferred embodiments, the master template further includes a master monitor operable during running of the model to monitor signals on the bus to which the master engine is coupled. This enables information about the signals passing to and from the master engine to be extracted for use as required in producing test results. More particularly, in one embodiment, the testbench includes a scoreboard for checking data integrity within the model, and the master monitor is operable to output data to the scoreboard indicative of the signals on the bus to which the master engine is coupled. Hence, as a result of this process, the scoreboard can keep track of data appearing on the bus to which the master engine is coupled, in order to allow checking as to whether that data is being routed as expected. For example, if the master engine issues a particular test stimuli, that test stimuli can be entered on the scoreboard, and should ultimately be routed via the bus interconnect block to the targeted slave device. If the data received by that slave device can also be extracted and passed to the scoreboard, then a check can be performed to confirm that the data appearing at that target slave corresponds with the data issued by the master engine.

Further, in preferred embodiments, the master template includes a checker operable during running of the model to check that signals at an interface between the master engine and the bus to which the master engine is coupled conform to a protocol for that bus. The bus specification will typically specify a set of predetermined rules that signals passing over the bus must obey in order to conform with the bus protocol. Hence, the checker can be provided to check that the signals at the interface between the master engine and the bus to which the master engine is coupled conform to those rules.

It will be appreciated that the sequence of test stimuli to be generated by the master engine may be defined in a variety of ways. However, in one embodiment, the master engine is arranged to generate the test stimuli in a random manner. For the kind of verification envisaged by embodiments of the present invention, which aim to cover many different permutations of transfer through a configurable device under test, the ability to generate a large number of random transfers is beneficial, since it promotes a coverage of a large number of test cases, with little overhead in manually crafting test stimuli for each test case.

In cases such as those envisaged by preferred embodiments of the present invention, where the number of permutations of transfer is large, it is expedient to have a generation facility that is easily constrained to meet desired coverage points. To achieve this, in one embodiment, an 'e' based verification platform is used, running on Specman Elite, this enabling production of a large number of randomly generated transfers that can be easily constrained with the added benefit that test cases can be reproduced for a particular randomisation seed.

In one embodiment of the present invention, the first set of templates includes a slave template defining a slave engine coupled to a bus and operable during running of the model to generate response signals in reply to test stimuli received from the representation of the device. Hence, for each slave type device indicated by the configuration data, the slave template can be used to produce within the testbench a slave engine for generating simulating response signals for inputting into the representation of the device.

In preferred embodiments, the first set of templates will include both a master template and a slave template to allow bus transfers to be initiated and responded to, with both signals being routed through the bus interconnect block to test the functionality of that bus interconnect block.

In preferred embodiments, the slave template includes a slave monitor operable during running of the model to monitor signals on the bus to which the slave engine is coupled. Hence, where a scoreboard is used, this allows the data obtained by the slave monitor to be output to the scoreboard to indicate the signals on the bus to which the slave engine is coupled.

Furthermore, in preferred embodiments, the slave template includes a checker operable during running of the model to check that signals at an interface between the slave engine and the bus to which the slave engine is coupled conform to a protocol for that bus.

Furthermore, in preferred embodiments, the slave engine is arranged to generate the response signals in a random manner, in a similar way to the master engine being arranged to generate the test stimuli in a random manner. As mentioned earlier, this has been found to be a beneficial technique for readily ensuring appropriate test coverage when using the test verification technique of embodiments of the present invention.

It will be appreciated that the configurable representation of the device may be arranged in a variety of ways to allow configuration to take place. However, in one embodiment, the representation of the device is formed from constituent blocks and the second set of templates defines the representation of the device and its constituent blocks.

It will be appreciated that the predetermined attributes specified by the configuration data may take a variety of forms. However typically the components of the data processing apparatus will include a number of different component types, for example masters, slaves, etc, and hence in preferred embodiments the predetermined attributes specified by the configuration data indicate the component type for each of the one or more components to be represented by the test environment of the testbench.

In embodiments where the device to be tested is a bus interconnect block, one of the component types is preferably a master type, and for each of said one or more components which is a master type, the predetermined attributes identify connections to any slave components within said one or more components that that master type component is connected to. For each component type, there may also be parameters such as data path width which are configurable.

Furthermore, in preferred embodiments, the connections are identified as either connections to a local slave component not shared with other master components, or as connections through a bus matrix of the bus interconnect block to a shared slave component shared with one or more other master components.

Viewed from a second aspect, the present invention provides a computer program product comprising code portions operable to control a computer to perform a method in accordance with the first aspect of the present invention.

Viewed from a third aspect, the present invention provides a method of generating a representation of a device to be incorporated in a data processing apparatus and a testbench providing a test environment that represents one or more components of the data processing apparatus with which that device is to be coupled, the representation of the device being configurable in dependence on the one or more components, the method comprising the steps of: (a) receiving a configuration data specifying predetermined attributes of the one or more components; (b) employing a processing tool to generate the testbench with reference to the configuration data and a first set of templates defining the test environment; and (c) employing the processing tool to generate the representation of the device with reference to the configuration data and a second set of templates defining the representation of the device.

Viewed from a fourth aspect, the present invention provides a computer program product comprising code portions operable to control a computer to perform a method in accordance with the third aspect of the present invention.

Viewed from a fifth aspect, the present invention provides a system for generating, for a representation of a device to be incorporated in a data processing apparatus, a testbench providing a test environment that represents one or more components of the data processing apparatus with which that device is to be coupled, the representation of the device being configurable based on configuration data specifying predetermined attributes of the one or more components, the system comprising: logic operable to read the configuration data used to configure the representation of the device; and generation logic operable to generate the testbench with reference to the configuration data and a first set of templates defining the test environment.

BRIEF DESCRIPTION OF THE DRAWINGS

The present invention will be described further, by way of example only, with reference to preferred embodiments thereof as illustrated in the accompanying drawings, in which.

DESCRIPTION OF PREFERRED EMBODIMENTS

For the purpose of illustrating a preferred embodiment of the present invention, the testing of an interconnect block for buses operating in accordance with the "Advanced Microcontroller Bus Architecture " (AMBA) specification developed by ARM Limited will be considered. Before discussing in detail the testing procedures, an example of the design of a data processing apparatus incorporating such an interconnect block will be given with reference to FIG. 1.

Figure 1:
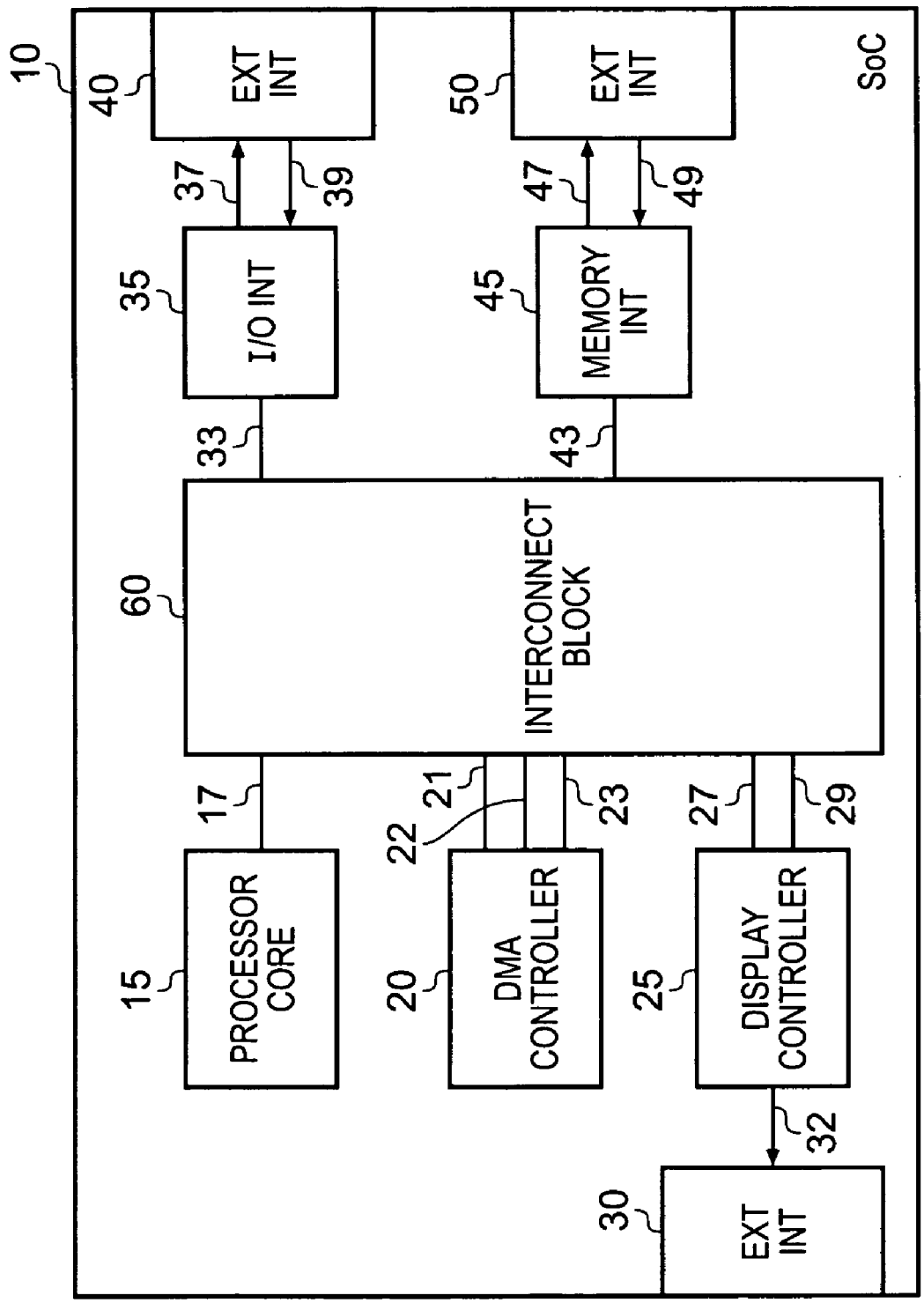
FIG. 1 is a block diagram illustrating an example design of a data processing apparatus.

FIG. 1 illustrates the design 10 of a data processing apparatus taking the form of a microcontroller chip or System on Chip (SoC), which may be used within a device such as a personal organiser, a mobile phone, a television set top box, etc. The AMBA specification is intended to allow the rapid building of SoC devices by the integration of a number of different components. The AMBA specification enables this process by providing a standard interface between each component and an AMBA bus to which that component is connected.

The SoC design 10 of FIG. 1 has a plurality of components 15, 20, 25, 35 and 45 that are interconnected by an arrangement of buses conforming to the AMBA specification. The actual interconnection of these buses is specified within the interconnect block 60. The interconnect block 60 includes a bus matrix which provides for the interconnection of multiple bus masters and slaves within the SoC 10. Each master device can access a different subset of the slave devices, and may also use a different memory map. Further, each slave can use one of a number of different arbitration schemes. For any particular instantiation of the interconnect block 60, such as that illustrated in FIG. 1, these various parameters will be defined, but in the general sense there are thousands of possible configurations of the interconnect block.

A master device can be considered to be a device that is designed to initiate transfer requests via a bus, whilst a slave device can be considered to be a device which is a recipient of such transfer requests, and issues responses onto a bus. In the FIG. 1 example, the processor core 15 is a master device which is connected to a bus 17 to enable it to initiate transfer requests, for example requests to read or write data from or to a memory via the memory interface 45.

The Direct Memory Access (DMA) controller 20 can operate as both a master device and a slave device, and in the particular example in FIG. 1 has two master ports connected to buses 21, 22 and a slave port connected to bus 23. The DMA controller 20 acts as a slave when it is receiving setup information over bus 23, for example as issued by the processor core 15. Further, via the two master ports, it is able to initiate two memory accesses simultaneously over the buses 21, 22, respectively, hence in effect simulating two master devices.

Similarly, the display controller 25 can act as both a master device and a slave device, and accordingly has a master port connected to a bus 27 and slave port connected to a bus 29. The display controller 25 acts as a master device when it is retrieving from a frame buffer data for outputting to a display, and acts as a slave device when it is receiving setup information, for example from the processor core 15. Any display data received by the display controller 25 can be output via path 32 to an external interface 30, from where the signals can be output to a display.

Both the input/output interface 35 and the memory interface 45 act solely as slave devices and typically process transfer requests received over buses 33, 43 respectively by communicating with an external device via the respective external interfaces 40, 50 and paths 37, 39, 47, 49.

The whole of the SoC design 10 will typically be defined in RTL, and accordingly each of the components illustrated in FIG. 1 can be considered as a separate RTL component. Each of the RTL components will typically be subjected to rigorous verification testing, either alone, or in combination with other RTL components, by constructing a testbench around those components to provide a test environment for running on a simulator tool. This verification process accounts for a significant proportion of the total design effort. Only once the RTL representation of the various components within the SoC have been sufficiently tested and verified is the SoC design 10 then synthesised into a sequence of hardware elements using a number of known synthesising tools. This results in a hardware design that can then be used to produce the actual hardware component.

The interconnect block design 60 is intended to be configurable, so that the same basic design can be used in a number of different implementations. Any particular configuration would then depend on the number of master devices and slave devices to be interconnected via the interconnect block, and in dependence on which master devices are intended to communicate with which slave devices, etc. However, this added flexibility in the design of the interconnect block adds to the complexity of verifying the generated design. Given the potentially complex interactions in the design, generating a suitable test sequence to fully exercise the generic design is a difficult task, and will not typically verify that all possible instantiations of the interconnect block 60 will always produce a correctly functioning interconnect block.

Figure 2:
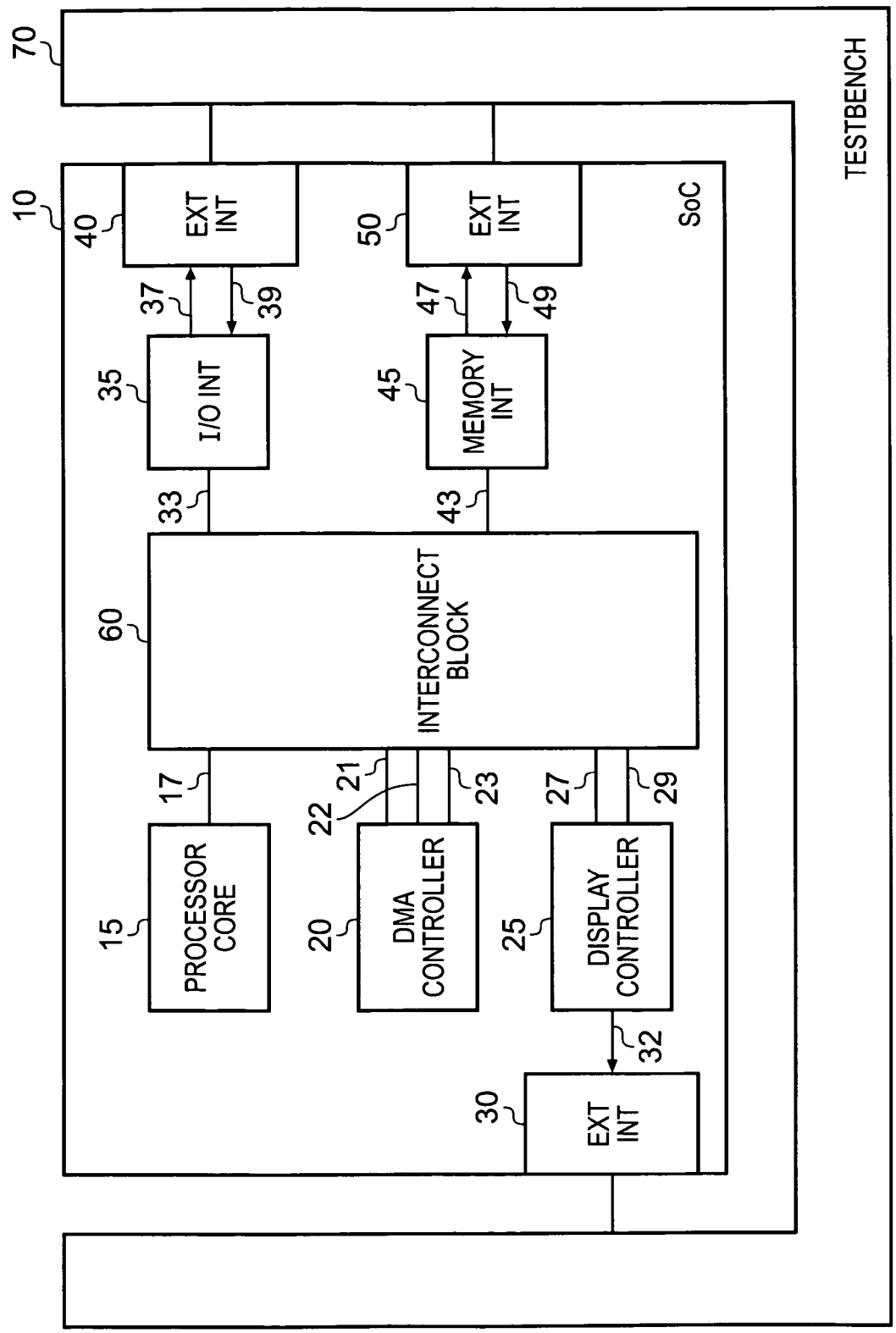
FIG. 2 illustrates one known technique for testing the interconnect block within the design of FIG. 1.

Accordingly, as illustrated in FIG. 2, the typical approach used to test a particular instantiation of the interconnect block 60 involves placing that interconnect block design (for example in RTL) into the SoC design, or at least a portion of the SoC design including the relevant master and slave components with which the interconnect block 60 is to be connected, and then constructing a testbench 70 around that SoC design 10 which will then generate test stimuli for feeding into the SoC design via the various external interfaces 30, 40, 50. Whilst rigorous testing of that SoC design using the FIG. 2 approach can produce reasonable confidence that the interconnect block design 60 is working as it should, it only allows indirect control of the input stimuli to the interconnect block, and cannot test all possibilities of transactions via the various interconnection of buses.

Figure 3:
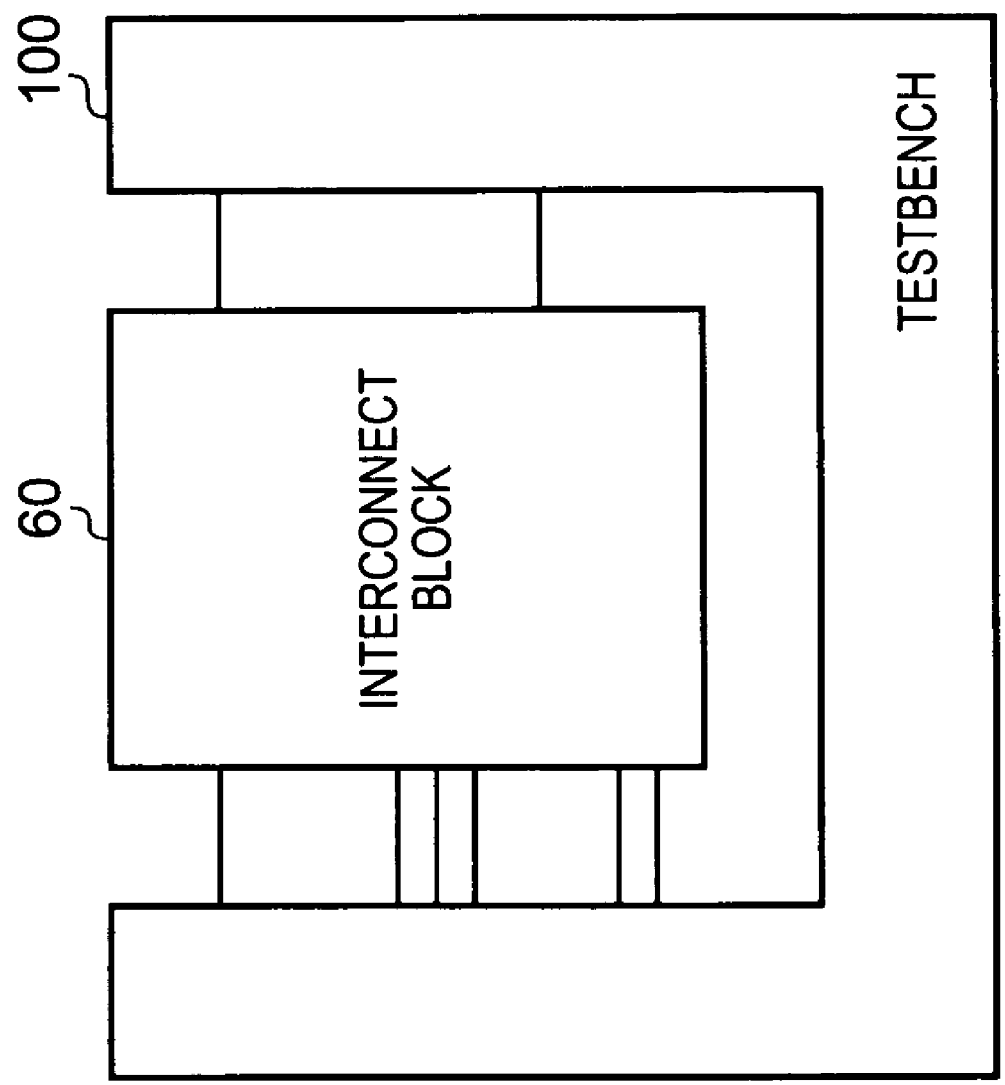
FIG. 3 schematically illustrates an interconnect block and a matching testbench generated in accordance with the techniques of an embodiment-of the present invention.

In accordance with embodiments of the present invention, the interconnect block 60 is tested in isolation as illustrated in FIG. 3, with a matching testbench 100 being generated for any particular instantiation of the interconnect block 60. Typically, such an approach would be prohibitive, since a specific testbench 100 would have to be written for each instantiation of the interconnect block 60, which as mentioned earlier may have thousands of possible configurations. However, as will be illustrated with reference to FIG. 4, the technique of the present invention allows a matching testbench 100 to be produced for any particular instantiation of the interconnect block 60 in an automated way.

Figure 4:
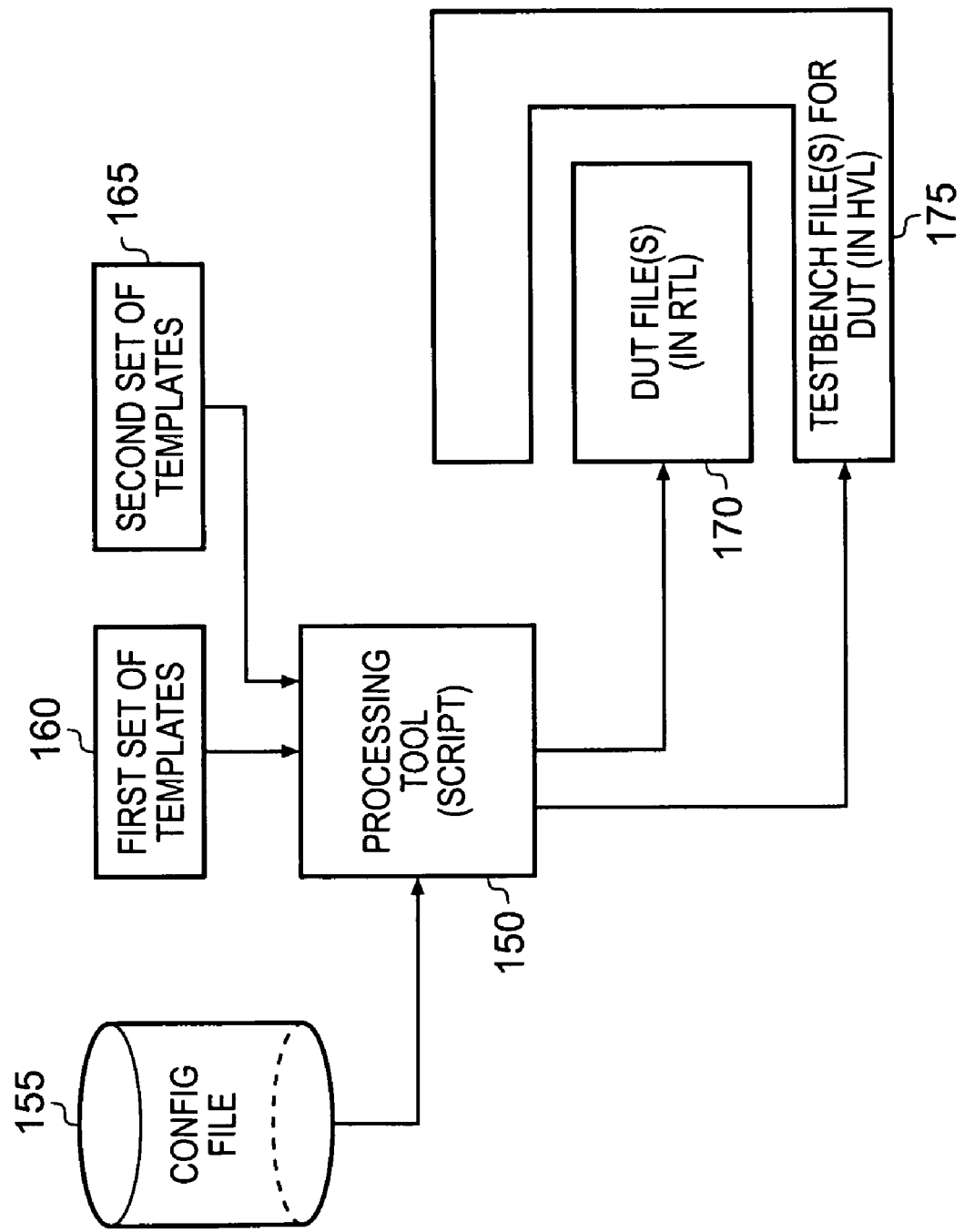
FIG. 4 schematically illustrates the use of a processing tool in accordance with one embodiment of the present invention to generate a Device Under Test (DUT) and a matching testbench.

As shown in FIG. 4, a processing tool 150 is provided for generating both the DUT 170 (in the above-mentioned example an interconnect block) and a matching testbench 175. A first set of templates 160 are used in the generation of the testbench 175, and a second set of templates 165 are used in the generation of the DUT 170.

Figure 5:
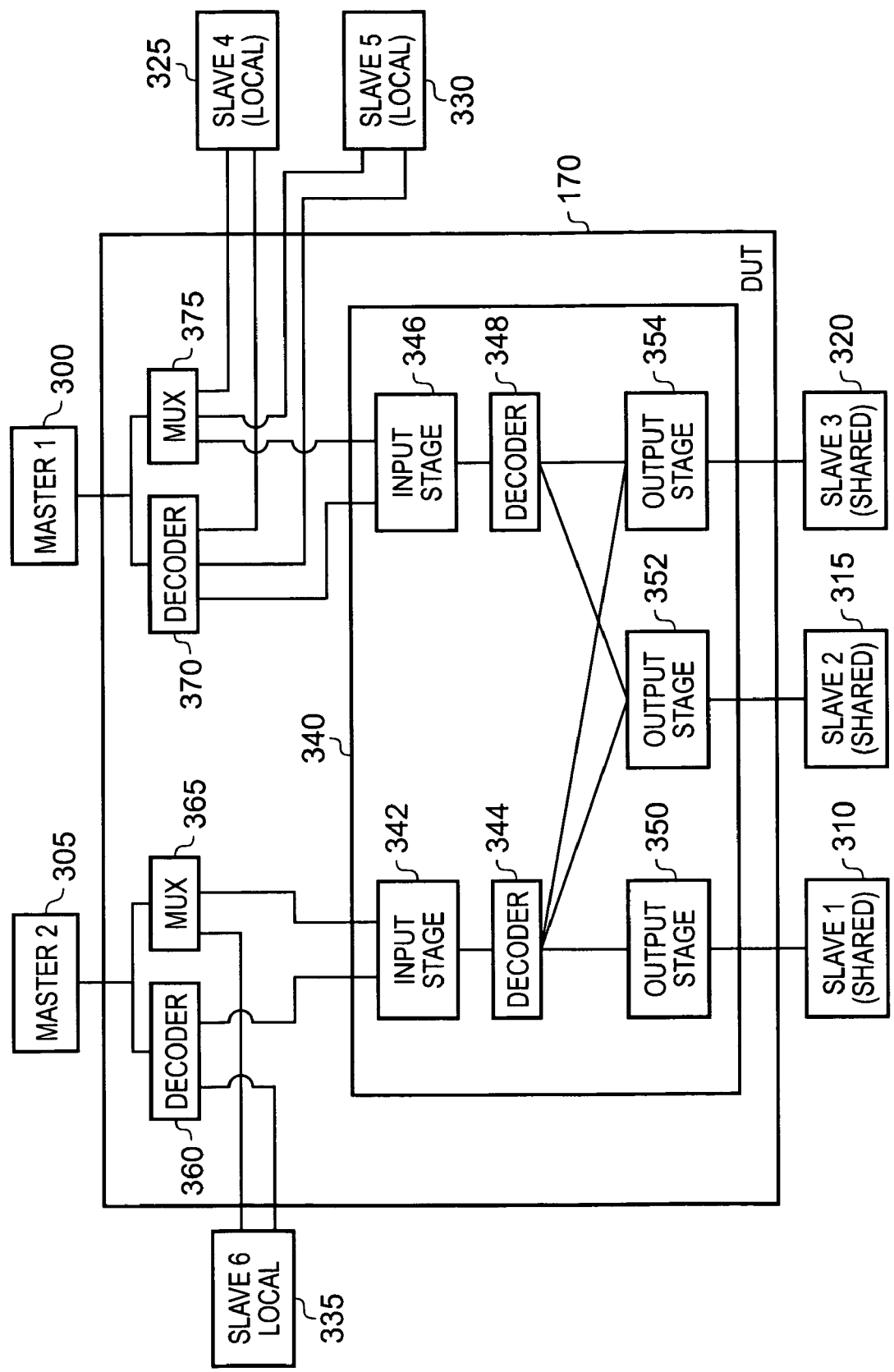
FIG. 5 is a block diagram illustrating an example interconnect block that may be produced by the processing tool of FIG. 4, and illustrates its connections to various master and slave devices.

Considering the interconnect block as an example of the DUT 170, an example interconnect block DUT 170 is illustrated in FIG. 5 for an example where two master devices 300, 305 are connected with six slave devices by the connections illustrated in FIG. 5. As can be seen from FIG. 5, the interconnect block includes a bus matrix 340 which includes for each master device 300, 305 a corresponding input stage 346, 342, and for each shared slave device 310, 315, 320 a corresponding output stage 350, 352, 354. Decoders 344, 348 are also provided for directing any particular transfer request issued by a master to the output stage corresponding to the target slave for that transfer request. As can be seen from the example of FIG. 5, the second master device 305 is arranged to be able to access any of the three shared slave devices 310, 315, 320, whereas the first master device 300 can only access two of those shared slave devices 315, 320.

In addition to the bus matrix, the bus interconnect block can also be provided with a decoder and multiplexer pair 360, 365, 370, 375 for each master device if that master device also has access to some local slave device not shared with other master devices. Hence, as an example, the first master device 300 has access to two local slave devices 325, 330, whilst the second master device 305 has access to a single local slave device 335.

Returning to FIG. 4, the second set of templates 165 used by the processing tool to generate the interconnect block DUT 170 will include definitions for each of the constituent blocks of that DUT illustrated in FIG. 5, and accordingly will include definitions of an input stage, an output stage, a decoder, a multiplexer, etc. For any particular instantiation of the interconnect block, the designer will then specify a configuration file 155 providing the information required to enable the processing tool to build a representation of that required interconnect block from the second set of templates 165. Hence, the configuration file or files will specify the number of master devices, the number of slave devices, and for each master device, an indication of the required connections to shared slave devices through the bus matrix and an indication of any connections to local slave devices.

In one particular embodiment of the present invention, the processing tool 150 takes the form of a script, and the constructs provided within the second set of templates are such that when they are processed by the script with reference to the configuration file 155, the processing tool will produce one or more output files defining the interconnect block DUT in RTL, for example VHDL or Verilog.

As also shown in FIG. 4, the script 150 is also able to read a first set of templates 160 and apply the same configuration file 155 in order to produce one or more output testbench files defining a testbench matched to the particular instantiation of the interconnect block 170 produced using that configuration file 155. An example of the testbench produced for the interconnect block illustrated in FIG. 5 will now be discussed with reference to FIG. 6. As can be seen from FIG. 6, each master device is represented within the testbench by a master engine, a master monitor and a checker which are connected by a bus to allow test stimuli to be input to the DUT 170. Similarly, each slave device is represented within the testbench by a slave engine, a slave monitor and a checker, again these elements being connected via a bus through which they can interface with the DUT 170.

Figure 6:
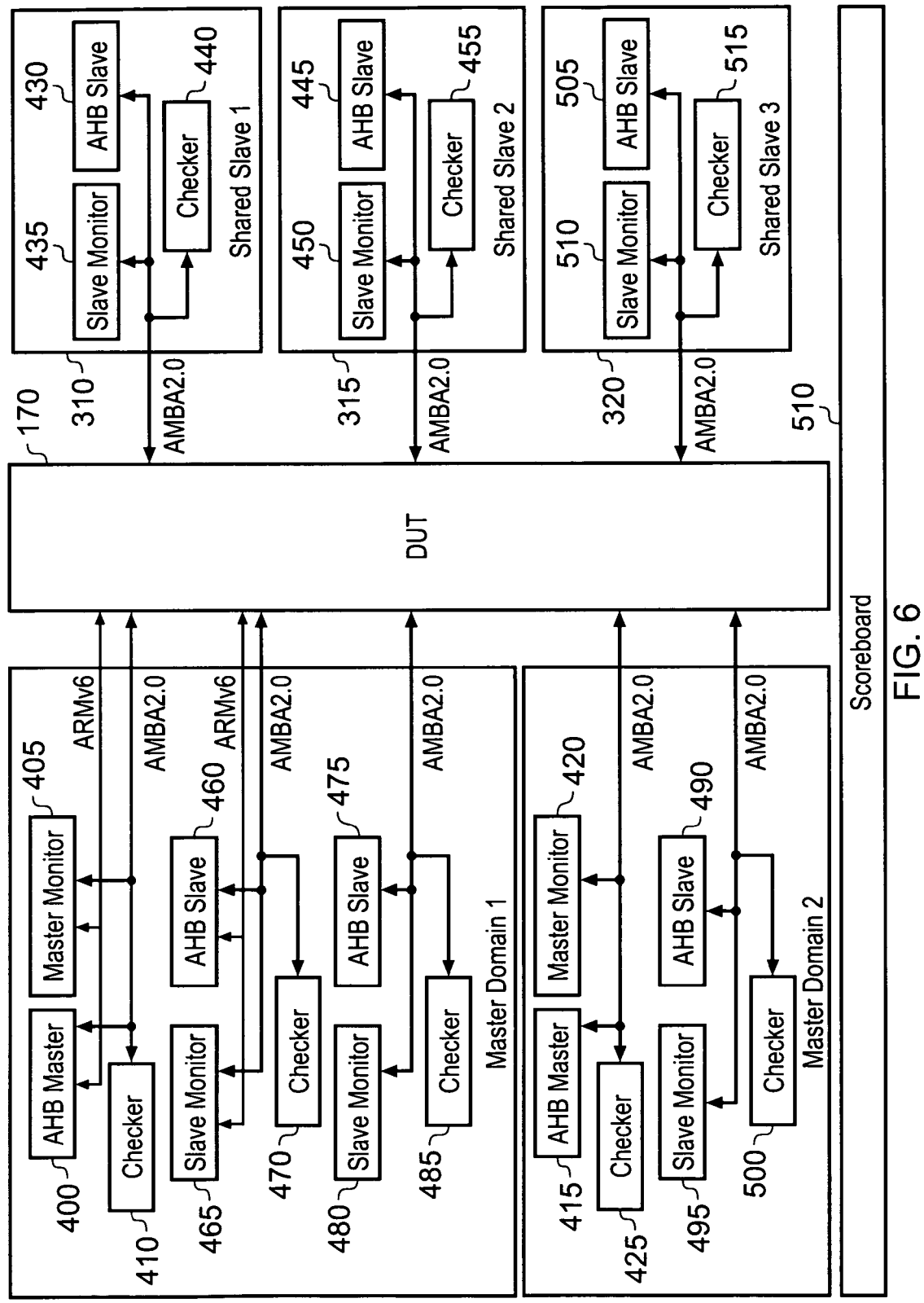
FIG. 6 is a block diagram illustrating a DUT and a testbench for that DUT as generated by the processing tool of FIG. 4.

As illustrated in FIG. 6, the actual AMBA buses can take at least two forms.

The basic AMBA bus (referenced in FIG. 6 as AMBA 2.0) is usually a 32-bit bus.

However, the AMBA bus specification defines certain extensions (referenced in FIG. 6 as ARM v6) which allow efficient use of larger buses, for example a 64-bit bus. Whether any particular master or slave is arranged to support those 64-bit extensions will be specified within the configuration file 155.

Hence, as can be seen from FIG. 6, the first master 300 of FIG. 5 is represented by a master engine 400, a master monitor 405 and a checker 410, and this master has been defined as supporting the 64-bit extensions to the AMBA bus. Similarly, the local slave 325 is represented by a slave engine 460, a slave monitor 465 and a checker 470, and again this slave device is defined as supporting the 64bit extensions. The other local slave 330 connected to the first master 300 is represented by slave engine 475, slave monitor 480 and checker 485.

The second master 305 is similarly represented by master engine 415, master monitor 420 and checker 425, whilst its associated local slave 335 is represented by slave engine 490, slave monitor 495 and checker 500.

The first shared slave 310 is represented by slave engine 430, slave monitor 435 and checker 440, the second shared slave 315 is represented by slave engine 445, slave monitor 450 and checker 455, whilst the third shared slave 320 is represented by a slave engine 505, a slave monitor 510 and a checker 515.

Hence, the first set of templates 160 illustrated in FIG. 4 will include definitions for the master engine, master monitor and master checker components and the slave engine, slave monitor and slave checker components, along with definitions for the AMBA bus, both with or without the 64-bit extensions. In one particular embodiment of the present invention, the constructs contained within the first set of templates are such that once they are processed by the script 150 with reference to the configuration file 155, they produce one or more output files representing the testbench in a High-level Verification Language (HVL), for example Vera or Specman, which provides a representation at a more abstract level than RTL. As will be appreciated by those skilled in the art, there may be individual portions within the testbench file or files that are in RTL. The benefit of using two different language types for the DUT and for its matching testbench is that it improves resilience to any errors, since it reduces the chance that a defect is generated in the DUT which is then perfectly matched in the testbench.

It has been found that the test strategy works particularly well when an HVL is used to implement the testbench, as it is frequently possible to write model components which can themselves be parameterised as they are included in the testbench. Thus, for example, an arbitration checker could just require an ordered list of input ports. Using an HVL also allows ready inclusion of configured functional coverage metrics, so that it can be verified that accesses have been performed from every master to every slave. It is even possible to specify that each master performs transfers randomly distributed between each of the slaves present.

From FIG. 6, it can be seen that the testbench consists of two main elements. The first main element is the connections to the individual ports of the DUT, in this particular example the master engines and slave engines, which enable random or directed test stimuli and responses to be provided. The second main element consists of port monitors and checkers to allow for protocol checking, transaction matching, arbitration checking, coverage monitoring, etc, in order to allow the design of the DUT to be verified. The form of the testbench of embodiments of the present invention is very well suited to use with an HVL, and random testing. Any change in the input parameters will result in a significant change in the progress of the verification test which would make the generation of a fixed test sequence and corresponding responses more difficult, and according the use of randomly generated test stimuli and responses will often be more preferable. Furthermore, the separating of the stimulus generation from the actual checking also allows the checking of important behaviour without making it necessary to model the entire design of the interconnect block in perfect accuracy.

Once the testbench and DUT have been generated using the approach illustrated in FIG. 4, they will then typically be loaded into a simulator tool and run in order to produce test results. In one embodiment of the present invention, the simulator tool is an RTL simulator which is overlaid with a Specman testing environment. The master engines and slave engines are in one embodiment configured to generate random transfers and responses, and any checking procedures will be implemented as separate modules, monitoring bus activity and recording it on a global scoreboard 510. In particular, each master monitor will output to the scoreboard 510 an indication of the signals on the bus to which the associated master engine is coupled, and similarly each slave monitor will issue data to the scoreboard indicative of the signals on the bus to which the associated slave engine is coupled.

In embodiments of the present invention, the configuration file defines an address map used by each master to identify the various slave devices, and accordingly for any particular transfer request, it is possible during this verification process to determine which slave is intended to be contacted. The scoreboard 510 from the signals it receives from the master monitors and slave monitors will hence be able to match up transfer requests issued by masters with the receipt of those transfer requests by the appropriate slave device. An entry is added to the scoreboard each time a transfer is issued from a master, and that entry is then deducted from the scoreboard when it is received by the appropriate slave, assuming it matches the transfer from the master. A similar approach can be used to track responses back from slaves to the masters. Hence, the scoreboard 510 can be used to identify any transfer requests which have not arrived at the desired slave, or any responses from slaves which have not been received by the appropriate master.

Each of the checkers provided within the testbench are arranged to check that signals at the interface between the associated master or slave engine and the bus conform to the protocol specified by the AMBA bus specification, with any violations of that protocol being recorded.

In preferred embodiments, information on coverage is provided using the in-built coverage tools provided by Specman. This will hence give an indication of how thoroughly the DUT has been tested.

Figure 7:
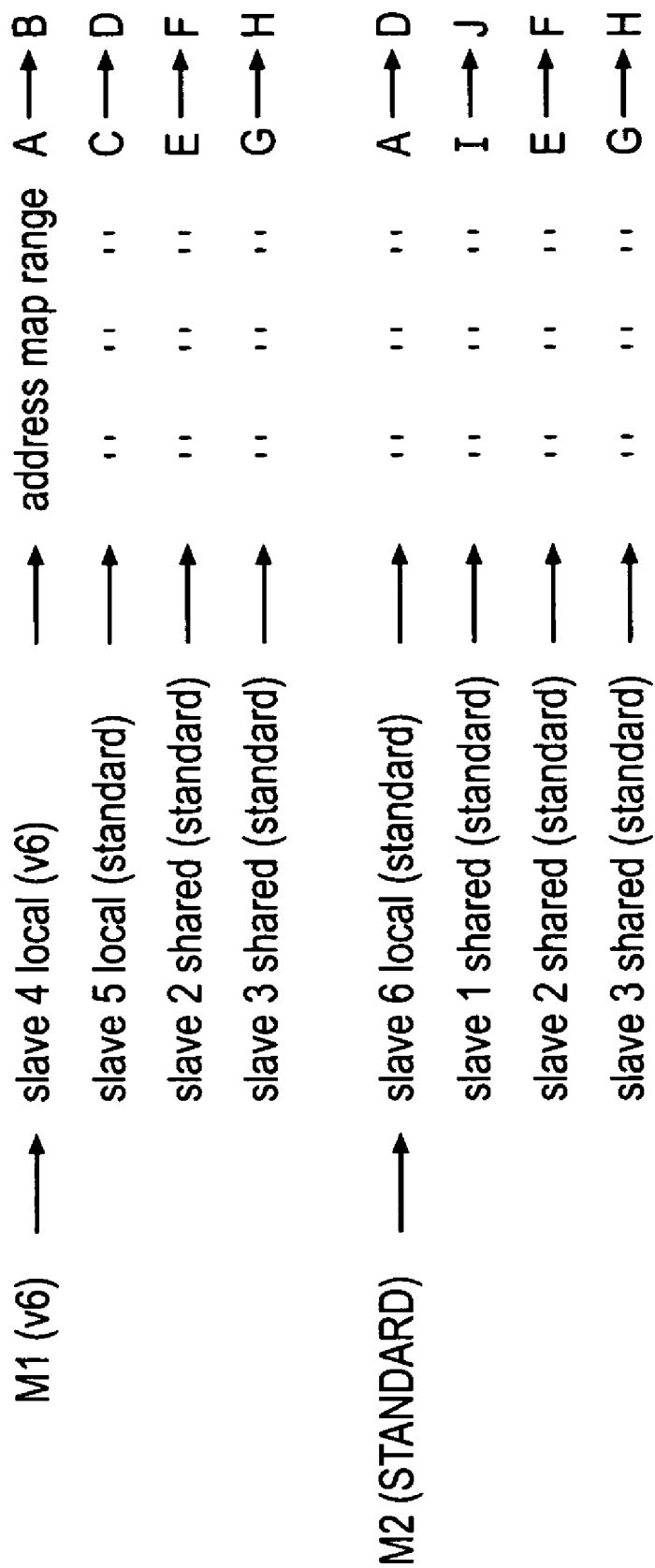
FIG. 7 schematically illustrates an extract from a configuration file that can be used as an input to the processing tool of FIG. 4.

FIG. 7 provides an extract of the configuration file 155 that could be specified for the DUT illustrated in FIG. 5. The first master device 300 is identified in FIG. 7 as M1 and the second master device 305 is illustrated in FIG. 7 as M2. As can be seen, the configuration file identifies for each master and slave device whether that master or slave device does or does not support the 64-bit extensions to the AMBA bus (in FIG. 7 the term "v6" being used to denote support for the 64-bit extensions, and the term "standard " being used to denote no support for such extensions). As can be seen from FIG. 7, each master may associate with each slave an address map range specifying a range of physical addresses that that master will use to access that slave. These address ranges need not be contiguous. Furthermore, whist shared slave devices might typically have the same address range specified by each master, the address ranges specified for local slave devices can overlap between masters. For example the address range A-D may be specified by the second master as the address range used by that second master to access slave 6, and the first master may also use portions of that address range A-D to specify its address map for its local slaves 4 and 5, in this example the address range A-B being used for slave 4 and the address range C-D being used for slave 5.

Figure 8:
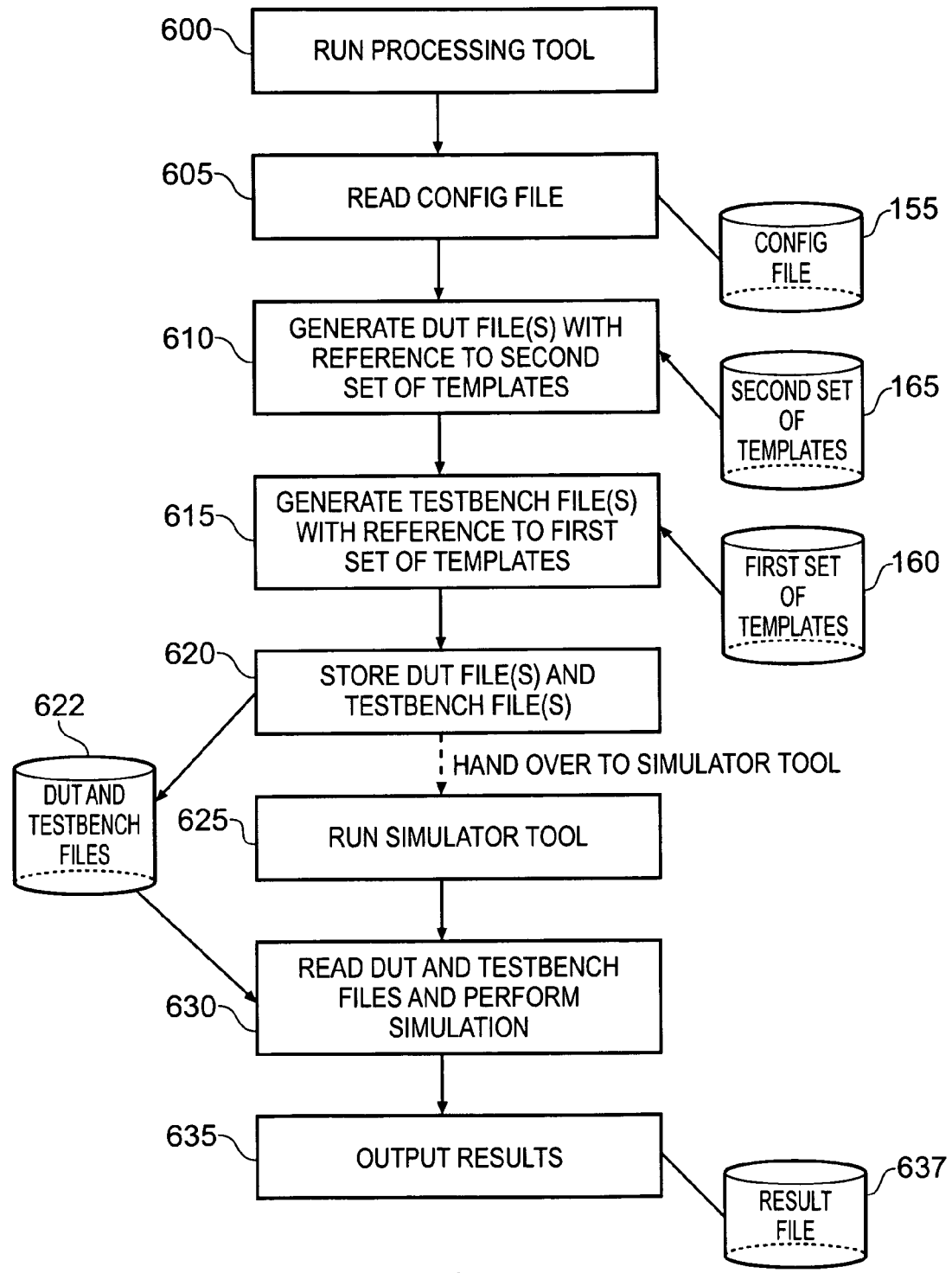
FIG. 8 is a flow diagram illustrating the processing performed on a computer to generate a DUT and a testbench in accordance with one embodiment of the present invention, and to then run a simulator tool to produce simulation results.

FIG. 8 illustrates the process that is performed in accordance with one embodiment of the present invention in order to generate a device under test and a matching testbench, and to then run a simulator to produce test results. In one embodiment, it is envisaged that these processing steps will be performed by appropriate software running on a workstation. At step 600, the processing tool is run, causing the configuration file 155 to be read at step 605. Then, at step 610, the processing tool is arranged to generate one or more DUT files with reference to the second set of templates 165. Further, at step 615, one or more testbench files are generated by the processing tool with reference to the first set of templates 160. As will be appreciated by those skilled in the art, the ordering of steps 610 and 615 is interchangeable. Both the DUT and testbench files are then stored at step 620 into a storage 622, for example a hard disk, a diskette, etc.

At this point, the process hands over to the simulator tool, which is then run at step 625. It will be appreciated that there is no need for the simulator tool to be run immediately following step 620, and the dotted line in FIG. 8 is intended to illustrate that there is no direct continuation of flow at this point. However, when the simulator tool is run, and the DUT and testbench files 622 are specified for running on the simulator tool, the simulator tool will then read out the DUT and testbench files from the storage 622 and perform a simulation at steps 630. This will result in the generation of some output results at step 635, which are then stored as one or more result files 637.

Figure 9:
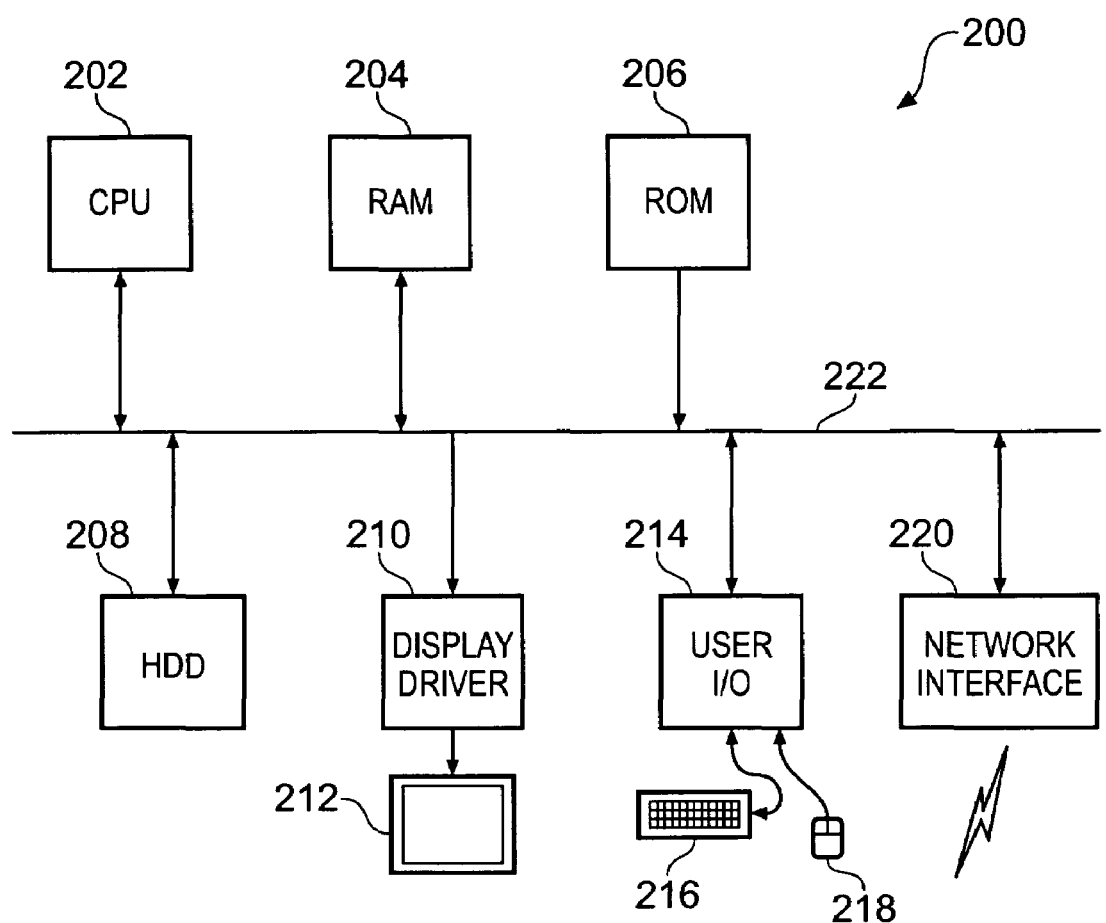
FIG. 9 is a block diagram of a computer system on which the processing tool of FIG. 4 and a simulator tool can be run.

FIG. 9 schematically illustrates a computer 200 of a type that may be used to execute computer programs to perform the functions described above. The computer 200 includes a central processing unit 202, a random access memory 204, a read-only memory 206, a hard disk drive 208, a display driver 210 and display 212, a user input/output circuit 214, a keyboard 216, a mouse 218 and a network interface circuit 220, all coupled via a common bus 222. In operation, the central processing unit 202 executes computer programs using the random access memory 204 as its working memory. The computer programs may be stored within the read-only memory 206, the hard disk drive 208, or retrieved via the network interface circuit 220 from a remote source. The computer 200 displays the results of its processing activity to the user via the display driver 210 and the display 212. The computer 200 receives control inputs from the user via the user input/output circuit 214, the keyboard 216 and the mouse 218.

The processing tool and its associated set of templates and/or the simulator tool may take the form of one or more computer programs stored within the computer system 200 on the hard disk drive 208, within the random access memory 204, within the read-only memory 206, or down-loaded via the network interface circuit 220. The computer program(s) may also be provided on a recording medium such as a compact disk or floppy disk drive that may be used for distribution purposes. When operating under the control of the above described computer program(s), the various components of the computer 200 serve to provide the appropriate circuits and logic for carrying out the above described functions and acts. It will be appreciated that the computer 200 illustrated in FIG. 9 is merely one example of a type of computer that may execute the computer program(s) and methods described above.

Further details of the techniques described above may be found in the following:

1.1 Conventions Used herein

Signals

Signal names are presented in bold font type.

Active low signals are suffixed with a lower case 'n'.

AHB signals are prefixed with an upper case 'H'.

AHB-Lite signals are prefixed with an upper case 'M'.

Signals on a slave interface are suffixed with an upper case 'S'.

Signals on a master interface are suffixed with an upper case 'M'.

The meaning of 'asserted' is logic HIGH for an active high signal and logic LOW for an active low signal.

Bytes, Half-words and Words

A byte is 8 bits.

A half-word is two bytes, i.e. 16 bits.

A word is 4 bytes, i.e. 32 bits.

1.2 Terms and abbreviations

This document uses the following terms and abbreviations.

| Term | Meaning |
|---|---|
| AHB | Advanced high-performance Bus |
| AMBA | Advanced Micro controller Bus Architecture |
| APB | Advanced Peripheral Bus |
| BusTalk | Testbench including a bus functional model to test AMBA peripherals |
| Corner Case | A special case in the functionality space, e.g. where a counter rolls over; new byte arrives at same instant when FIFOs becomes full or empty |
| D&T | Development and Test Project Phase |
| DI | Detailed Investigation Project Phase |
| DUT | Device Under Test |
| Level 0 | Standalone Block Level. Module instantiated in standalone test bench, with the objective of achieving full functional coverage on that module |
| Level 1 | Register Access Level, In-situ testing to confirm memory map reset, read and write properties |
| Level 2 | Integration Level. In-situ testing designed to prove out inter-block connectivity, for example timer block connected to interrupt control block |
| Level 3 | In System Block Level. As for level4, but tests directed at specific block(s) |
| Level 4 | System Level. In situ testing, for example interrupt testing with FIFO-full conditions, usually by running verification code on ARM model. May include external models to provide realistic scenarios, e.g. Denali memory models, UART model, PCI model |
| Micropack | An Example AMBA System from ARM |
| PrimeCell | High quality reusable IP from ARM |
| System | The top element of the system architecture, specification tree, or system breakdown structure that is comprised of one or more products and associated life cycle processes and their products and services |
| TBS | To be specified |
| Trickbox | Memory mapped (behavioral) test bench component to facilitate verification |
| TRM | Technical Reference Manual |
| Tube | Memory mapped, non-synthesizesable device for debug purposes. Allows the writing of debug messages to a log-file |
| Validation | Checking the design intent |
| Verification | Checking the equivalence of two views (e.g. RTL and gate level) |

2 Scope

This document describes the tool and templates used in bus infrastructure generation.

It describes the features of the perl script amba.pl and the syntax used in the template files.

This script is designed to produce rtl and specman files used for the bus infrastructure and its verification.

3 Introduction

This document describes the tool used for generating platform bus infrastructure. The intent is to have a tool that can be used to automatically generate the amba interconnect for platforms, when given a system description.

It will also create a test environment to test the connections and arbitration.

The tool comprises of a set of template files, and a top-level script, written in perl.

The script takes template files and creates output files based on settings it read from a user-written configuration file "amba_config.xml".

The file is written with xml-style syntax, and is parsed by the perl script. It contains a system-level description of the amba interconnect from a master and slave perspective. It also contains a list of files to be made.

Template files of the form "<output file>_t<.ext>" are then read in and used to create output files in a destination directory.

The language of the template and output files does not affect the process and is not understood by the script.

The system description file can be modified easily in order to expand a platform to meet customer requirements.

4 Configuration File

This chapter specifies the syntax used in the configuration file. This file is the file that needs to be written by the user in order to define the desired system.

A configuration file is produced for each basic PWP platform, this can be edited to change the platform structure.

The amba_config.xml file is of the following form:
<cfgfile>
Configuration information
</cfgfile>

The configuration information is then split into various sections. Sections are delimited by
<section name="SectionName ">
Section information
</section>

Sections may appear in any order in the configuration file. Sections should not be repeated.

Note: The syntax of the configuration file is important, the perl script performs no syntax checking of the input file.

4.1 Sections 4.1.1 Global Settings<section name="GlobalSettings">

This (optional) section contains settings that will effect the rtl output.
<entry prefix="Name"/>

This entry will apply a prefix to all the block names generated by the script. Note, if a prefix is specified then this prefix will also be applied to decoder blocks.

4.1.2 Files<section name="Files">

Should contain a list of files using the output filename. Optional to specify a destination directory, by using a relative path (default is work). The entry names should not include any global prefix, this is automatically prepended by the script during generation.

e.g.
<entry name="outputfile1.txt" dest="work"/>
<entry name="outputfile2.txt" dest="mydir"/>

A number of special entry names exist:

"BusMatrix Components"—This will build the output stages and multiplexors needed by the system. It will delete any existing files in the destination directory matching Mux* and Output*.

"Generation Constraints"—This will create the required generation configuration files for the AHB XVC Masters used in the testbench.

Note: When specifying an output file you must ensure to provide a template file of the form described above. See following section(s).

4.1.3 MasterList<section name="MasterList ">

This section is used to describe the master port interfaces to the system. There should be one entry for every required port on the top-level block, optionally indexed by consecutive entry numbers.

e.g.
<entry number="0" tag="LCDM "/> optional fields:

| | |
|---|---|
| [name="CLCD"] | Any string, defaults to tag |
| [datawidth="32"] | 32 \| 64 |
| [v6="none"] | none \| exclusive \| bstrb \| all |
| [porttype="ahb"] | ahb \| lite \| apb \| exp \| core \| corep |
| [decode="Decoder"] | Any string, defaults to Decoder<entry number> |
| [bmdecode="BMDec"] | Any string, defaults to BMDec<entry number> |

Tag is used to map onto signal and port names, name is used to identify instantiations. Datawidth applies to the read and write data busses. V6 can be specified as none (default), all, unalign (for unaligned transfer support), and exclusive (for exclusive access support).

Porttype can be specified as ahb (default), lite (Ahb-lite), apb and exp (expansion). Lite and expansion ports use HMASTLOCK instead of HLOCK. Expansion master ports have a select and hready input, as well as default slave inputs (and will have a local slave, decoder and mux instantiated in the testbench). A corep port has a select and hready input.

Decoder and bmdecode should be used to specify a block name for the decoder to be used for instantiations. The names specified in this section will have any global prefix applied to them.

Note: The masters should be declared in order of their priority in the busmatrix system. That is, master 0 will have highest priority.

4.1.4 SlaveList<section name="SlaveList">

Should contain a list of slave ports to the system, indexed by consecutive entry numbers.

e.g.
<entry number="0" tag="LCDS" [name="CLCD"] [datawidth="32"] [v6="none"] [porttype="ahb"/>

Tag is used to map onto signal and port names, name is used to identify instantiations (defaults to tag). Datawidth can be 32 or 64 bit, default is 32. V6 can be specified as none (default), all, unalign (for unaligned transfer support), and exclusive (for exclusive access support). Porttype can be ahb (default), lite, apb or exp. Shared expansion slaves are those that require all AHB signals on the output, local expansion slaves are those local to expansion master ports.

Note: The slaves should be declared with shared slaves first, in order of the output required.

4.1.5 SharedInterconnect<section name="SharedInterconnect">

Should contain an entry for each master, describing connections to slave through the busmatrix.

e.g.
<master number="0" shared_slaves="0,1,2,3,4"/>

Master and slave numbers refer to the index of the entry in the section above.

Note: Order of declaration is important, and should match decoder logic 4.1.6 LocalInterconnect<section name="LocalInterconnect">

Should contain an entry for each master, describing connections to local slaves.

e.g.
<master number="0" local_slaves="0,1,2,3,4"/>

Master and slave numbers refer to the index of the entry in the section above.

Note: Order of declaration is important, and should match decoder logic. The local expansion should be first.

4.1.7 Address Map<section name="AddrMap">

This is required to produce an address map used for verification purposes. It is not used to generate decode or remap logic, only to declare remap signals in the hierarchy.

It can contain two different types of entry, and one subsection:
<entry remap_sig="0" name="REMAPSIGNALNAME"/>

This defines the name of a remap signal. Entries must be indexed as with other entries.
<entry remap_state="0" name="RemapState1" signal_vals="0,1,2,3"/>

This defines a remap state in the verification environment. Note, the index is purely an index and does not correlate to Remap signal values in any way. The relationship of remap signals to remap state is specified by the signal_vals entry. This is a decimal encoding of a concatenation of the remap signals, with remap signal 0 forming the LSB and remap signal n forming the MSB.

Another entry is allowed, used to declare unused remap signals for specific decoders
e.g.
<entry decoder="DecoderA " remap_nused="0,1,3,5"

When the \remap\tag is used in a template file, the script will omit remap signals matching these numbers from the output.

4.1.7.1 Address Map<master_addr_map name="0">

Is a subsection, ended with</master_addr_map>. It can contain two types of entry:
<entry master="0" default_slave="11"/>

Defines the default slave for a master. If this entry is omitted, the first declared local slave is used.
<entry remap_state="Normal" low_addr="0x00000000" high_addr="0x0FFFFFFF" slave="1"/>

This defines an address map for a particular master. The fields refer to remap state (as defined above), lowest address of the region, highest address of the region, and the destination slave's id (as defined above).

Note: It is possible to specify multiple slaves to an address entry (to allow masters to see different local slaves). The testbench will use the first matching entry to a slave a master can "see".

Where remap state does not affect the entry, a value X in the remap state can be used to signify this.

Where no address map entry is specified for a particular address, the masters default slave will be used.

5 Generated rtl

The tool generates all necessary infrastructure logic to tie together the various components.

The generated rtl components include:
makefile
InputStage.v
BusMatrix.v
Bus.v
ExclusiveLogic.v
And the appropriate variations of:
OutputArbX.v
OutputStageX.v
MuxXStoM.v Note: these files are created destructively, and overwrite any previous files of this type. In the case of the last three, files matching "Output*.v" and "Mux*.v" will also be removed.

The tool does not generate decoder blocks. Note that the instantiation's port list will be generated, not inferred from a specified block. Care must be taken when creating the decoders that the port identifiers match the order of interconnect specified in the config file.

e.g. For
<master number="0" local_slaves="0,1,2,3,4"/>

The decoder instantiation will connect HSEL0 to the first slave declared in local_slaves (0), HSEL1 to slave 1 etc.

Where a 64-bit master is used, a decode layer is put in to select between the 32-bit region and the 64-bit slave. Currently the tool will expect one (and only one) 64-bit local slave for each master. This should be of mpmc type, i.e the MPMC port for that master. The name for this decoder is always "Decoder64".

6 Generated Testbench

The tool will generate a testbench.

This consists of an rtl testbench which instantiates the bus infrastructure, and an 'e' based test environment, including ARM AHB XVC masters and slaves on each port on the bus system. A series of monitors scoreboard bus activity and check that transfers reach intended destinations without being corrupted. An arbitration checker checks the operation of the busmatrix, and several functional checkers check the operation of various infrastructure components.

These are then used to test first all of the address entries for each master for each permutation of remap signals, and then a random soak test for each permutation of remap signals.

The environment uses the flexible XTSM controlled test environment, so adding additional custom tests post-generation is relatively straightforward.

7 Directory structure

The directories are structured so that the generic data is stored in the 'global' directory and the data specific to the particular bus matrix being generated is stored in the local directory.

7.1 Directory structure.

The directory structure used for both the global and local data is described in this section.

7.1.1 Global directory

This directory contains components which are not specific to any particular bus implementation. The contents of the global/bus_gen directory are split into the directories:
1. The generation script (bin/amba.pl).
2. The specman verification components which are used in the generated test bench.
3. The verilog components which are instantiated within the generated amba infrastructure.

Figure 10:
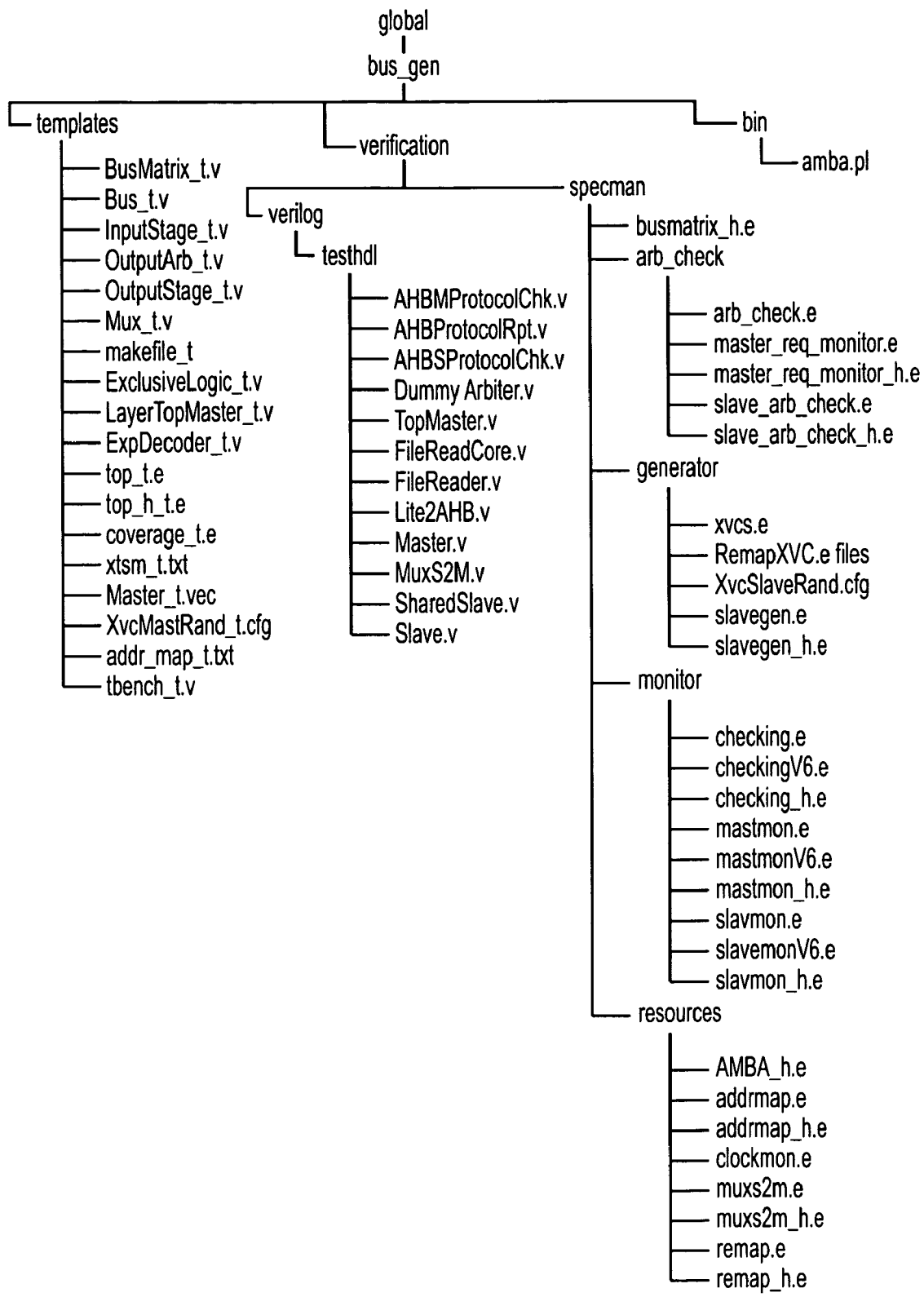
FIG. 10 illustrates the structure of an example generation and test tool within a global directory of one embodiment.

The structure of the bus matrix data within the 'global' directory is shown in FIG. 10.

7.1.2 Bus generation directory

The bus generation data which is specific to a particular bus implementation is stored in a separate bus generation directory. This directory contains:
1. The generation templates in the amba directory.
2. The generated files which are split between the verilog/rtl_source, verification/verilog/tbench and verification/specman directories as appropriate.
3. The verilog source files specific to the implementation (e.g. the decoders) are contained in the verilog/rtl_source directory.

Figure 11:
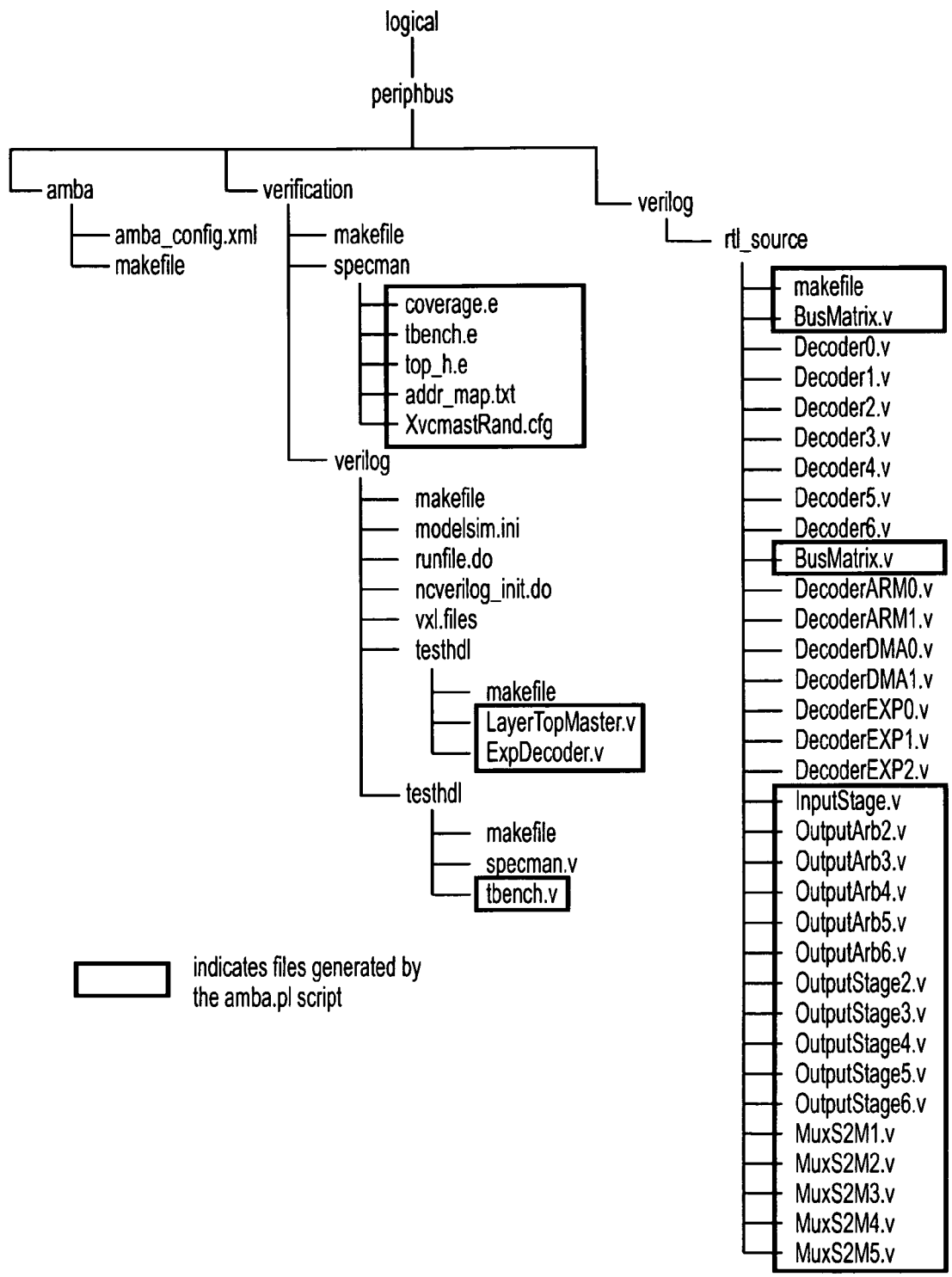
FIG. 11 illustrates the structure of the example bus interconnect within a bus generation directory of one embodiment.

The structure of the bus matrix data within the bus generation directory is shown in FIG. 11.

In order to support this data structure the following functions are required:

The verification/verilog/testhdl/makefile is used compile the Verilog source files from the global/bus_gen/verification/verilog/testhdl directory into the local directory.

8 Appendix—template files

This chapter describes the syntax of the template files used by the script.

The script uses a token scheme to identify portions of the code to be modified.

Tokens are delimited by %%TOKEN%%.

There are two types of token, macro-replacement types and code repitition types.

Macro-replacement types will replace the token with a specific set of information, whereas code repition types will mark an area of code to be duplicated.

Note: macro-replacement types cannot be used within areas bounded by repitition tokens, nor can nested repitions be used.

8.1 Replacement types

%%NUMMASTERS%%

Is replaced with the number of master ports in the system.

%%NUMSLAVES%%

Is replaced with the number of slave ports in the system.

%%REMAPSIGS%%

Is replaced with the number of remap signals defined in the system.

%%PORTLIST%%

Is replaced with a portlist description, commented with// prefix.

%%ADDRMAP%%

Is replaced with an address map description, as used by the addrmap.e file in the testbench.

8.2 Repeat types

%%PRIMASTER%%

Will repeat a section of code for the number of masters in the system. For iterative fields, will also repeat per local slave.

%%PRISLAVE%%

Will repeat a section of code for the number of slaves in the system.

%%PRIBMINPUTS%%

Will repeat a section of code for the number of master ports on the busmatrix. For iterative fields, will also repeat per slave it connects to.

%%PRIBMOUTPUTS%%

Will repeat a section of code for the number of slave ports on the busmatrix. For iterative fields, it will also repeat per master port it connects to.

%%PRIREMAPSTATE%%

Will repeat a section of code for the number of remap states in the system.

%%PRIREMAPSIG%%

Will repeat a section of code for the number of remap signals in the system.

8.2.1 Replacement fields

A number of fields can be used that are replacable on each repeat of a code section, based on the iteration of master, slave, port etc.

These are as follows:

| Field | Replacement Master | Slave | Input | Output | Remapstate | Remapsig |
|---|---|---|---|---|---|---|
| \<porttype\> /.*/ \</porttype\>¥ | If "porttype" /.*/ else nothing | If "porttype" /.*/ else nothing | If "porttype" /.*/ else nothing | If "porttype" /.*/ else nothing | | |
| \bw\ | HBSTRB Width - 1 | HBSTRB Width - 1 | HBSTRB Width - 1 | HBSTRB Width - 1 | | |
| \db\ | Databus width | Databus width | Databus width | Databus width | | |
| \dw\ | Databus width - 1 | Databus width - 1 | Databus width - 1 | Databus width - 1 | | |
| \xp\ | HPROT width - 1 | HPROT width - 1 | HPROT width - 1 | HPROT width - 1 | | |
| \xr\ | HRESP width - 1 | HRESP width - 1 | HRESP width - 1 | HRESP width - 1 | | |
| \$ | Local slave number (iterative) | Index | Output port number (iterative) | Port number | Name | Name |
| \* | Master tag | Master (if local) or slave tag | Master tag | Master tag (iterative) | List (, separated) of signal values state refers to. | |
| \^ | Slave tag (iterative) | Slave tag | Slave tag (iterative) | Slave tag | | |
| \# | Index | | Port number | Master port number (iterative) | Index | Index |
| \~ | Number of local slaves + 1 if it has shared slaves | | Number of Slaves | Number of Masters | | |
| \@ | Local slave index (iterative) | | Index of Slave (iterative) | Iteration (iterative) | | |
| \remap\ | Remap signal name (iterative) | | | | | |

-continued

| Field | Replacement Master | Slave | Input | Output | Remapstate | Remapsig |
|---|---|---|---|---|---|---|
| \£ | | Slave Port | | Slave index | | |
| \& | Master Port | | | Master Index (iterative) | | |
| \, | Last comma fix* | Last comma fix* | Last comma fix* | Last comma fix* | | |

*Will replace with "," for all but last iteration, then will remove the trailing comma.
¥These replacements will work for each iteration, and test against the current iterative object to see if the tagged section should be kept or removed. See table below for full list.

| Tag | Object test |
|---|---|
| Sixtyfourbit | Datawidth == 64 |
| Exclusive | Architecture == (all || exclusive) |
| Bstrb | Architecture == (all || bstrb) |
| Local | # Shared Slaves != 0 |
| Myslave | (For Master) Is this the iteration for the first local slave (local expansion) |

The tool \chop\ can be used to chomp the rest of line where required, in this way a series of logical condtional code inclusion can be created:
  e.g.

| | |
|---|---|
| if true | <tag> Code <\tag> |
| if false | <tag> \chop\ <\tag> |
| OR | <tag1> Code <\tag1> <tag2> Code <\tag2> |
| AND | <tag 1><tag2> Code <tag1><tag2> |
| Etc. | |

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

I claim:

1. A method of generating a testbench for a representation of a device to be incorporated in a data processing apparatus, the testbench providing a test environment that represents one or more components of the data processing apparatus with which that device is to be coupled, the representation of the device being configurable based on configuration data specifying predetermined attributes of the one or more components, the method comprising the steps of:
   (a) receiving the configuration data used to configure the representation of the device;
   (b) generating the testbench with reference to the configuration data and a first set of templates defining the test environment; and
   (c) generating the representation of the device with reference to the configuration data and a second set of templates defining the representation of the device,
   wherein the representation of the device is formed from constituent blocks and the second set of templates defines the representation of the device and its constituent blocks.

2. A method as claimed in claim 1, further comprising the step of: providing a processing tool having access to the configuration data and the first and second sets of templates, said steps (b) and (c) being performed by the processing tool.

3. A method as claimed in claim 2, wherein the processing tool is operable independent of a language produced by the processing tool from each template.

4. A method as claimed in claim 1, wherein the representation of the device is provided in a first language type and at said step (b) a part of the testbench defined by a number of the templates in the first set is generated in a second language type different to the first language type.

5. A method as claimed in claim 4, wherein said first language type is a Register Transfer Language (RTL), and said second language type is a High level Verification Language (HVL).

6. A method as claimed in claim 1, wherein said device is a bus interconnect block.

7. A method as claimed in claim 6, further comprising the step of:
   employing a simulation tool to run a model of the data processing apparatus using the representation of the device and the testbench;
   wherein the first set of templates includes a master template defining a master engine coupled to a bus and operable during running of the model to generate test stimuli for input via the bus to the representation of the device.

8. A method as claimed in claim 7, wherein the master template includes a master monitor operable during running of the model to monitor signals on the bus to which the master engine is coupled.

9. A method as claimed in claim 8, wherein the testbench includes a scoreboard for checking data integrity within the model, and the master monitor is operable to output data to the scoreboard indicative of the signals on the bus to which the master engine is coupled.

10. A method as claimed in claim 7, wherein the master template includes a checker operable during running of the model to check that signals at an interface between the master engine and the bus to which the master engine is coupled conform to a protocol for that bus.

11. A method as claimed in claim 7, wherein the master engine is arranged to generate the test stimuli in a random manner.

12. A method as claimed in claim 6, further comprising the step of:
   employing a simulation tool to run a model of the data processing apparatus using the representation of the device and the testbench;
   wherein the first set of templates includes a slave template defining a slave engine coupled to a bus and operable during running of the model to generate response signals in reply to test stimuli received from the representation of the device.

13. A method as claimed in claim 12, wherein the slave template includes a slave monitor operable during running of the model to monitor signals on the bus to which the slave engine is coupled.

14. A method as claimed in claim 13, wherein the testbench includes a scoreboard for checking data integrity within the model, and the slave monitor is operable to output data to the scoreboard indicative of the signals on the bus to which the slave engine is coupled.

15. A method as claimed in claim 12, wherein the slave template includes a checker operable during running of the model to check that signals at an interface between the slave engine and the bus to which the slave engine is coupled conform to a protocol for that bus.

16. A method as claimed in claim 12, wherein the slave engine is arranged to generate the response signals in a random manner.

17. A method as claimed in claim 1, wherein there are a number of different component types, and the predetermined attributes specified by the configuration data indicate the component type for each of said one or more components.

18. A method as claimed in claim 17, wherein said device is a bus interconnect block, and wherein one of the component types is a master type, and for each of said one or more components which is a master type, the predetermined attributes identify connections to any slave components within said one or more components that that master type component is connected to.

19. A method as claimed in claim 18, wherein the connections are identified as either connections to a local slave component not shared with other master components, or as connections through a bus matrix of the bus interconnect block to a shared slave component shared with one or more other master components.

20. A computer readable medium encoded with a computer program comprising code portions operable to control a computer to perform a method as claimed in claim 1.

21. A system for generating a testbench for a representation of a device to be incorporated in a data processing apparatus, the testbench providing a test environment that represents one or more components of the data processing apparatus with which that device is to be coupled, the representation of the device being configurable based on configuration data specifying predetermined attributes of the one or more components, the system comprising:
   logic operable to read the configuration data used to configure the representation of the device; and
   generation logic operable to generate the testbench with reference to the configuration data and a first set of templates defining the test environment and to generate the representation of the device with reference to the configuration data and a second set of templates defining the representation of the devices,
   wherein the representation of the device is formed from constituent blocks and the second set of templates defines the representation of the device and its constituent blocks.

22. A system as claimed in claim 21, further comprising:
   a processing tool having access to the configuration data and the first and second sets of templates, the generation logic being provided by the processing tool.

23. A system as claimed in claim 22, wherein the processing tool is operable independent of a language produced by the processing tool from each template.

24. A system as claimed in claim 21, wherein the representation of the device is provided in a first language type, and during generation of the testbench by the generation logic a part of the testbench defined by a number of the templates in the first set is generated in a second language type different to the first language type.

25. A system as claimed in claim 24, wherein said first language type is a Register Transfer Language (RTL), and said second language type is a High level Verification Language (HVL).

26. A system as claimed in claim 21, wherein said device is a bus interconnect block.

27. A system as claimed in claim 26, further comprising:
   a simulation tool operable to run a model of the data processing apparatus using the representation of the device and the testbench;
   wherein the first set of templates includes a master template defining a master engine coupled to a bus and operable during running of the model to generate test stimuli for input via the bus to the representation of the device.

28. A system as claimed in claim 27, wherein the master template includes a master monitor operable during running of the model to monitor signals on the bus to which the master engine is coupled.

29. A system as claimed in claim 28, wherein the testbench includes a scoreboard for checking data integrity within the model, and the master monitor is operable to output data to the scoreboard indicative of the signals on the bus to which the master engine is coupled.

30. A system as claimed in claim 27, wherein the master template includes a checker operable during running of the model to check that signals at an interface between the master engine and the bus to which the master engine is coupled conform to a protocol for that bus.

31. A system as claimed in claim 27, wherein the master engine is arranged to generate the test stimuli in a random manner.

32. A system as claimed in claim 26, further comprising:
   a simulation tool operable to run a model of the data processing apparatus using the representation of the device and the testbench;
   wherein the first set of templates includes a slave template defining a slave engine coupled to a bus and operable during running of the model to generate response signals in reply to test stimuli received from the representation of the device.

33. A system as claimed in claim 32, wherein the slave template includes a slave monitor operable during running of the model to monitor signals on the bus to which the slave engine is coupled.

34. A system as claimed in claim 33, wherein the testbench includes a scoreboard for checking data integrity within the model, and the slave monitor is operable to output data to the scoreboard indicative of the signals on the bus to which the slave engine is coupled.

35. A system as claimed in claim 33, wherein the slave template includes a checker operable during running of the model to check that signals at an interface between the slave engine and the bus to which the slave engine is coupled conform to a protocol for that bus.

36. A system as claimed in claim 32, wherein the slave engine is arranged to generate the response signals in a random manner.

37. A system as claimed in claim 21, wherein there are a number of different component types, and the predetermined attributes specified by the configuration data indicate the component type for each of said one or more components.

38. A system as claimed in claim 37, wherein said device is a bus interconnect block, and wherein one of the component types is a master type, and for each of said one or more components which is a master type, the predetermined attributes identify connections to any slave components within said one or more components that that master type component is connected to.

39. A system as claimed in claim 38, wherein the connections are identified as either connections to a local slave component not shared with other master components, or as connections through a bus matrix of the bus interconnect block to a shared slave component shared with one or more other master components.

40. A method of generating a testbench for a representation of a device to be incorporated in a data processing apparatus, the testbench providing a test environment that represents one or more components of the data processing apparatus with which that device is to be coupled, the representation of the device being configurable based on configuration data specifying predetermined attributes of the one or more components, the method comprising the steps of:
  (a) receiving the configuration data used to configure the representation of the device;
  (b) generating the testbench with reference to the configuration data and a first set of templates defining the test environment; and
  (c) generating the representation of the device with reference to the configuration data and a second set of templates defining the representation of the device,
  wherein said device is a bus interconnect block,
    the method further comprising employing a simulation tool to run a model of the data processing apparatus using the representation of the device and the testbench,
    wherein the first set of templates includes a master template defining a master engine coupled to a bus and operable during running of the model to generate test stimuli for input via the bus to the representation of the device,
    wherein the master template includes a master monitor operable during running of the model to monitor signals on the bus to which the master engine is coupled, and
    wherein the testbench includes a scoreboard for checking data integrity within the model, and the master monitor is operable to output data to the scoreboard indicative of the signals on the bus to which the master engine is coupled.

41. A method of generating a testbench for a representation of a device to be incorporated in a data processing apparatus, the testbench providing a test environment that represents one or more components of the data processing apparatus with which that device is to be coupled, the representation of the device being configurable based on configuration data specifying predetermined attributes of the one or more components, the method comprising the steps of:
  (a) receiving the configuration data used to configure the representation of the device;
  (b) generating the testbench with reference to the configuration data and a first set of templates defining the test environment; and
  (c) generating the representation of the device with reference to the configuration data and a second set of templates defining the representation of the device,
    wherein said device is a bus interconnect block and the method further comprises the step of:
    employing a simulation tool to run a model of the data processing apparatus using the representation of the device and the testbench,
    wherein the first set of templates includes a slave template defining a slave engine coupled to a bus and operable during running of the model to generate response signals in reply to test stimuli received from the representation of the device,
    wherein the slave template includes a slave monitor operable during running of the model to monitor signals on the bus to which the slave engine is coupled, and
    wherein the testbench includes a scoreboard for checking data integrity within the model, and the slave monitor is operable to output data to the scoreboard indicative of the signals on the bus to which the slave engine is coupled.

42. A method of generating a testbench for a representation of a device to be incorporated in a data processing apparatus, the testbench providing a test environment that represents one or more components of the data processing apparatus with which that device is to be coupled, the representation of the device being configurable based on configuration data specifying predetermined attributes of the one or more components, the method comprising the steps of:
  (a) receiving the configuration data used to configure the representation of the device;
  (b) generating the testbench with reference to the configuration data and a first set of templates defining the test environment; and
  (c) generating the representation of the device with reference to the configuration data and a second set of templates defining the representation of the device,
    wherein there are a number of different component types, and the predetermined attributes specified by the configuration data indicate the component type for each of said one or more components,
    wherein said device is a bus interconnect block,
    wherein one of the component types is a master type, and for each of said one or more components which is a master type, the predetermined attributes identify connections to any slave components within said one or more components that that master type component is connected to, and
    wherein the connections are identified as either connections to a local slave component not shared with other master components, or as connections through a bus matrix of the bus interconnect block to a shared slave component shared with one or more other master components.

* * * * *